(12) United States Patent
Hennig et al.

(10) Patent No.: US 11,408,953 B2
(45) Date of Patent: Aug. 9, 2022

(54) MAGNETIC RESONANCE IMAGING METHOD

(71) Applicant: Albert-Ludwigs-Universitat Freiburg, Freiburg (DE)

(72) Inventors: Jurgen Hennig, Freiburg (DE); Maxim Zaitsev, Freiburg (DE)

(73) Assignee: Albert-Ludwigs-Universität Freiburg, Freiburg (DE)

( * ) Notice: Subject to any disclaimer, the term of this patent is extended or adjusted under 35 U.S.C. 154(b) by 108 days.

(21) Appl. No.: 16/782,228

(22) Filed: Feb. 5, 2020

(65) Prior Publication Data

US 2020/0249296 A1 Aug. 6, 2020

(30) Foreign Application Priority Data

Feb. 5, 2019 (DE) .......................... 102019102799.3

(51) Int. Cl.
*G01R 33/385* (2006.01)
*G01R 33/48* (2006.01)
*G01R 33/561* (2006.01)

(52) U.S. Cl.
CPC ..... *G01R 33/3852* (2013.01); *G01R 33/4824* (2013.01); *G01R 33/5617* (2013.01)

(58) Field of Classification Search
CPC ............ G01R 33/3852; G01R 33/5617; G01R 33/4824; G01R 33/4818; G01R 33/4826
See application file for complete search history.

(56) References Cited

U.S. PATENT DOCUMENTS

| | | | | |
|---|---|---|---|---|
| 5,604,434 A * | 2/1997 | Schomberg | ........ | G01R 33/4824 324/307 |
| 5,650,723 A | 7/1997 | Meyer | | |
| 7,583,082 B1 * | 9/2009 | Hu | ...................... | G01R 33/4824 324/307 |
| 2009/0069664 A1 * | 3/2009 | Kim | ..................... | G01R 33/561 600/410 |
| 2011/0241680 A1 | 10/2011 | Mussnang et al. | | |
| 2012/0112745 A1 * | 5/2012 | Takizawa | ........... | G01R 33/4824 324/309 |
| 2013/0147483 A1 * | 6/2013 | Kurokawa | ............. | G01R 33/34 324/310 |
| 2014/0145718 A1 * | 5/2014 | Gulaka | .............. | G01R 33/4818 324/309 |
| 2016/0313431 A1 * | 10/2016 | Beck | ................ | G01R 33/56509 |

FOREIGN PATENT DOCUMENTS

DE 10 2010 013 672 A1 10/2011

* cited by examiner

*Primary Examiner* — Rishi R Patel
(74) *Attorney, Agent, or Firm* — Volpe Koenig

(57) ABSTRACT

Improvements in MR spiral imaging are provided in that spiral segments (2 to 8) are reordered, in particular alternately traversed and/or permuted. Moreover, repeatedly approaching the same post-trajectory points (16) between the acquisitions of the spiral segments (2 to 8) is provided, in which the post-trajectory points (16) are located outside of the center (18) of k-space (9), preferably outside of a region (20) of the k-space (9) covered by the spiral segments (2 to 8).

19 Claims, 10 Drawing Sheets

Fig. 5A
Fig. 5B
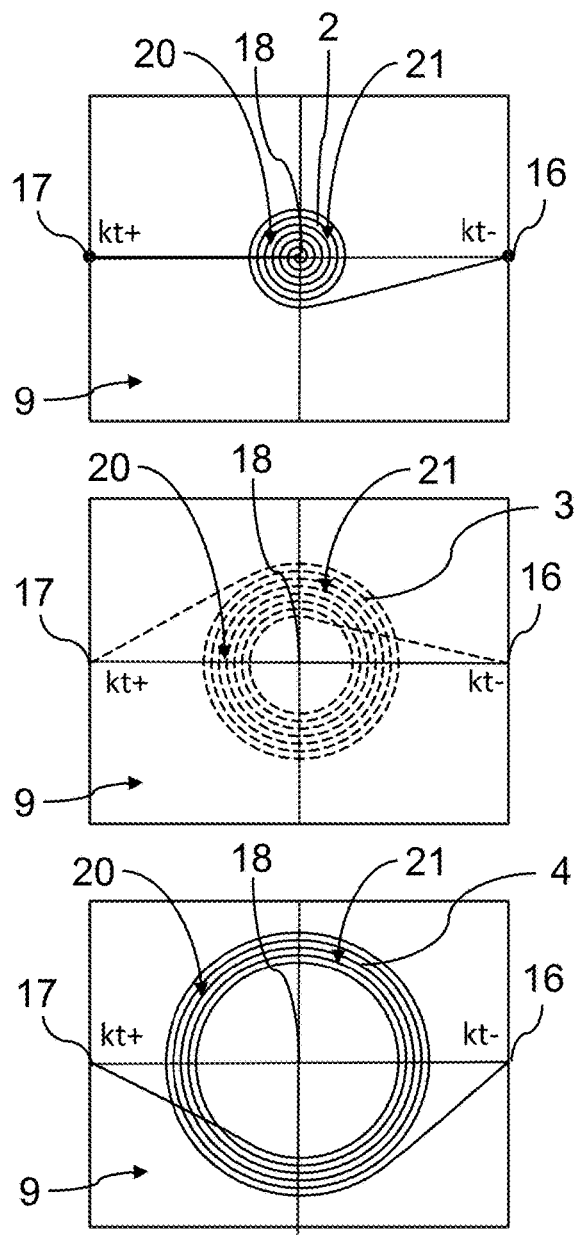
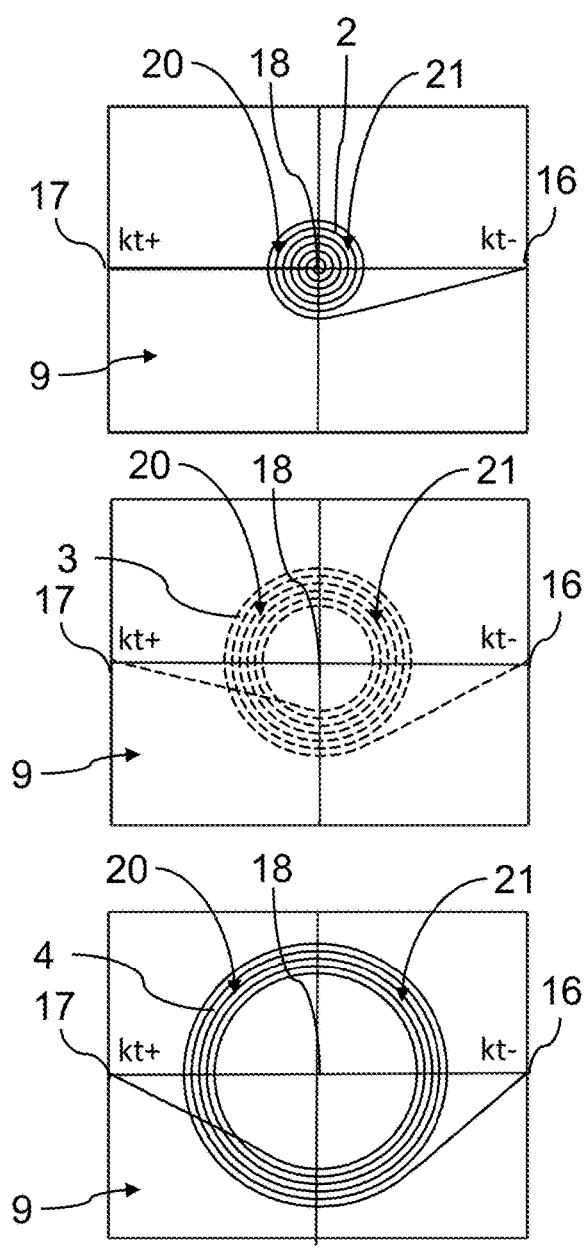
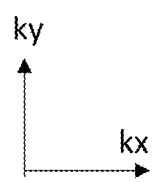
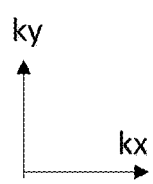

MAGNETIC RESONANCE IMAGING METHOD

INCORPORATION BY REFERENCE

The following documents are incorporated herein by reference as if fully set forth: German Patent Application No. 10 2019 102 799.3, filed Feb. 5, 2019.

TECHNICAL FIELD

The invention relates to a magnetic resonance imaging method. The practice of switching gradient fields for spatial encoding purposes is known from practice. Three gradient fields, the field gradients of which are oriented perpendicular to one another in each case, are usually available. Here, the gradient fields are switched in such a way that a trajectory is traversed in k-space, the space of spatial frequencies, which is complementary to real space. In addition to Cartesian and radial trajectories, spiral-shaped trajectories are also often used in practice. The present invention relates to such spiral-shaped trajectories. The spiral-shaped trajectories can be any type of spiral trajectory, such as an Archimedean, logarithmic, variable density and/or continuous spiral, for example.

BACKGROUND

Within the scope of this invention, the abbreviation "RF" is used synonymously with "radiofrequency". Within the scope of the invention, the abbreviation "MR" is used synonymously with "magnetic resonance". Phrases such as "a plurality of", "a multiplicity of" or the like also comprise a number of only two, even if a number of more than two is usually preferably realized.

A high efficiency of data acquisition by way of a spiral-shaped scanning of k-space is facilitated by the spatial encoding by spiral-shaped trajectories. In this case, the duration of the readout given a spatial resolution dx and volume coverage FOV firstly depends on technical factors such as the gradient strength and switching time and is secondly restricted by physiology since fast modulations of the field gradients can occur when generating a spiral-shaped trajectory, which could lead to stimulation of peripheral nerves. Here, the temporal readout is restricted by the decay constant T2*. Inhomogeneities of the magnetic fields, too, may trigger dephasing effects of the generated signals.

There are applications, such as those of functional MM, for example, in which the entire spiral-shaped k-space trajectory is traversed during a single acquisition interval. However, only images with a low spatial resolution are obtainable thereby.

Therefore, performing the signal acquisition in segmented fashion for generating high-resolution images is known, particularly for radiological diagnostics. Here, only some of the k-space information is read during each acquisition interval. Therefore, the practice of providing acquisition intervals during which a magnetic resonance signal is acquired is known, wherein gradient fields are switched in such a way for spatial encoding that spiral segments of a spiral-shaped scanning pattern formed in k-space are traversed during the acquisition intervals. An image reconstruction can be carried out by means of an image reconstruction algorithm after or during signal acquisition, for the purposes of generating an MR image.

Here, the scanning pattern combines the k-space points of the traversed trajectory. The trajectory describes both the k-space coordinates of the traversed k-space points and the temporal sequence of the scanned k-space points. The scanning pattern associated with this trajectory, by contrast, only describes the coordinates of the scanned k-space points in k-space. The scanning pattern itself therefore provides no statement about the time at which the k-space points are scanned.

Therefore, a trajectory in k-space is traversed by way of the gradient fields. The traversed k-space points of the trajectory form a spiral-shaped scanning pattern during the acquisition intervals. The trajectory can deviate from a spiral form outside of the acquisition intervals.

Following an RF pulse, the subsequent trajectory starts at a point kt+, referred to below as pre-trajectory point, in k-space. From there, it is transferred by way of suitable gradients along a so-called pre-trajectory to the start point, denoted ksp+, of the respective spiral segment. After traversing the spiral segment to the end point ksp− of the relevant spiral segment, the trajectory is guided along a so-called post-trajectory to the point denoted the post-trajectory point kt− below. Pre-trajectory and post-trajectory can each be referred to as transition trajectory as well. Here, the part relevant to image encoding is only the middle segment, during which the signal is read. In the technical implementation, the signal readout may also extend over the pre-trajectory and post-trajectory and the data points relevant to the image reconstruction are subsequently selected. The aforementioned acquisition intervals need not necessarily comprise the entire time period of the signal readout.

A subsequent RF refocusing pulse leads to the post-trajectory point being mirrored at the center of k-space. If the post-trajectory point kt− is located in k-space in point-mirror-inverted fashion with respect to the pre-trajectory point kt+, a subsequent trajectory following the application of an RF refocusing pulse starts at the pre-trajectory point kt+ again. Therefore, post-trajectory point of the preceding spiral segment and pre-trajectory point of the subsequent spiral segment are separated if they are not situated in the k-space center, wherein the coordinates thereof are rotated through 180° about the center of k-space. It could also be said that pre-trajectory point and post-trajectory point have inverted coordinates.

Further, generating a respective RF pulse, usually by an RF transmitter coil, prior to the acquisition intervals is known in the case of such a segmented acquisition. The RF pulses allow the magnetization of the test object to be influenced in a targeted manner by manipulating spins. Thus, switching the gradient fields between the acquisition intervals in such a way that the same post-trajectory point in k-space is repeatedly reached, in particular at times defined by RF pulses, is known. Choosing the center of k-space as post-trajectory point is known.

Methods of the above-described type are known from practice. However, unwanted image artifacts can be observed in a multiplicity of such applications.

SUMMARY

The invention is based on the object of improving the usability of spiral imaging for magnetic resonance imaging.

In order to achieve this object, one or more features of the invention are provided. In particular, provision is consequently made, according to the invention, for acquisition intervals during which a magnetic resonance signal is acquired to be provided, for gradient fields to be switched in such a way for spatial encoding that spiral segments of a spiral-shaped scanning pattern formed in k-space are traversed during the acquisition intervals and for the gradient fields to be switched between the acquisition intervals in such a way that the same post-trajectory point in k-space is repeatedly reached. Further, the post-trajectory point being spaced apart from the center of k-space is therefore proposed, in particular for achieving the aforementioned object according to the invention. It is particularly advantageous for said post-trajectory point to be located outside of a region of k-space covered by the spiral segments. Preferably, the aforementioned repeatedly reached post-trajectory point is reached at times defined by RF pulses. Thus, the post-trajectory point could have been reached prior to, but no later than exactly at, these times. Preferably, the post-trajectory point has been reached no later than the time at which the RF pulse starts. Particularly preferably, the times defined by the RF pulses are a start point of the respective RF pulse. The RF pulses are preferably RF refocusing pulses.

Approaching a k-space point away from the center of k-space, or even outside of the scanned k-space, is advantageous in relation to a central post-trajectory point in that interference signals generated by the RF pulses, which may result from off-resonances in particular, are able to obtain different encodings than the desired signal, and so interference artifacts are reduced. As a result, the image quality of the spiral imaging and the usability of the spiral imaging for MR imaging can be improved.

For achieving the aforementioned object, the invention further provides, according to the invention, for acquisition intervals during which a magnetic resonance signal is acquired to be provided and for gradient fields to be switched in such a way for spatial encoding that spiral segments of a spiral-shaped scanning pattern formed in k-space are traversed during the acquisition intervals. Further, spiral segments, which directly follow one another in the spiral-shaped scanning pattern, being traversed in opposite directions is therefore proposed, in particular for achieving the aforementioned object according to the invention. Here, the direction forms a direction of rotation in relation to the center of k-space. Preferably, even-numbered spiral segments are alternately traversed in the opposite direction to odd-numbered spiral segments.

It is particularly advantageous for the two aforementioned solutions to the object to be combined with one another.

Traversing adjacent spiral segments in opposite directions is advantageous in that discontinuous changes of signal properties can be avoided at the connection points of the spiral segments. This improves the image quality and the usability of the spiral imaging. Thus, a particular consequence of the reversal could be that a connection point between two adjacent spiral segments forms a common start or end point of the respectively scanned trajectory portion for said segments. Signal interferences that accumulate with the time duration of the trajectory can thus be significantly reduced.

The features according to the invention can be realized by any measurement sequence admitting spatial encoding. As explained in more detail below, the invention offers particular advantages in configurations of the aforementioned solutions that provide for a sequence of spin echoes to be generated by means of an RF excitation pulse and subsequent RF refocusing pulses, wherein the RF pulses are formed by the RF refocusing pulses. It is particularly advantageous if the acquisition intervals are provided between the RF refocusing pulses.

A person skilled in the arts knows how an RF excitation pulse can be realized. By way of example, an RF excitation pulse can be characterized in that the application thereof to a test object, such as a patient, for example, can generate a transversal magnetization, the precession of which generates an MR signal. To this end, a longitudinally oriented magnetization can be tilted into the transversal plane, in particular. To this end, use can be made of RF excitation pulses with different flip angles. It may be particularly advantageous to use a flip angle of 90°. This is sufficiently well known to a person skilled in the art.

A person skilled in the art also knows how an RF refocusing pulse can be realized. By way of example, an RF refocusing pulses can be characterized in that it generates a spin echo. Specifically, while the signal has a decay constant of T2* as a consequence of magnetic field inhomogeneities, the inversion of dephasing implemented by the refocusing pulse leads to the dephased spins once again being able to contribute in coherent fashion to a common signal, and so a spin echo arises, which merely decays with the decay constant T2. Different flip angles can be used for an RF refocusing pulse. It can be particularly advantageous to use a flip angle of 180°. This is sufficiently well known to a person skilled in the art.

The RF excitation pulse and the RF refocusing pulses following the former form an RF pulse train.

The combination of an RF excitation pulse with a plurality of subsequent RF refocusing pulses is also referred to as a multi-echo sequence. By way of example, the multi-echo sequence can be a RARE (rapid acquisition with relaxation enhancement) sequence, which is also referred to as FSE (fast spin echo) sequence or TSE (turbo spin echo) sequence in practice. The fact that a suitable choice of the phases of excitation and refocusing pulses according to the so-called CPMG method allows an optimization of the signal intensity of the individual echoes is also known. How the echo train length can be extended by optimized flip angles is also known.

Preferably, the RF refocusing pulses are equidistant. This is the case in a RARE sequence, in particular. The spin echo is formed in the middle between two RF refocusing pulses.

In accordance with the mapping properties between k-space and image space, the pixel resolution of an image encoded by a spiral-shaped k-space trajectory is defined by the diameter of the trajectory, the field of view (FoV) is defined by the radial spacing (pitch) from one revolution to the next. The trajectory required to encode an image of a desired FoV and at a desired resolution may be so long under realistic conditions that image artifacts arise as a result of imperfections in the acquisition—in particular field inhomogeneities and off-resonance effects. The fact that the acquisition can be performed with a plurality of partial spirals in such cases is known; said partial spirals have an identical diameter but have a pitch that has been increased by a factor given by the number of partial spirals. The acquisition duration for each partial spiral is then shorter by the same factor than the acquisition duration of the entire spiral.

The speed at which the trajectory is traversed is given by the strength of the employed gradients. What should be considered as parameter or boundary condition that restricts faster speeds is that the change in the employed gradients must not be faster than the maximum admissible so-called slew rate, which often is not subject to technical restrictions in the case of applications to humans but by the threshold for stimulating peripheral nerves (PNS).

As a consequence, a plurality of partial spirals are acquired during spiral imaging, which partial spirals are each rotated with respect to one another by an angle that generally remains unchanged. However, a problem arising when applying this principle to multi-echo sequences, where individual partial spirals are read in respectively different refocusing intervals, is that the signal intensity of each spiral segment is respectively modulated by the signal decay T2 along the RF pulse train. In k-space, this leads to a T2-dependent signal modulation in the direction of rotation and hence to image artifacts. For multi-echo sequences, it is therefore advantageous to segment along a spiral. In particular, provision can be made for the spiral segments to form a spiral-shaped scanning pattern that is formed in k-space. The latter leads to a T2-weighting along a radial direction in k-space. Such a low-pass filter forms significantly fewer image artifacts than corresponding filtering along a direction of rotation in k-space.

Repeatedly approaching the same above-defined post-trajectory point kt− in k-space at times defined by the RF refocusing pulses is advantageous in the case of multi-echo methods for the purposes of avoiding image artifacts. By way of example, the times defined by the RF refocusing pulses can be the times at which there is an inversion of the k-space coordinates of a currently scanned point in k-space. Since the refocusing pulse implements a reflection of the k-space point reached immediately before the refocusing pulse, the k-space trajectory between two refocusing pulses must be designed in such a way that the pre-trajectory point kt+ and the post-trajectory point kt− are mirrored through the k-space zero with respect to one another. Should kt+ be located at the k-space center, then kt− is also located in the k-space center.

However, approaching the center of k-space may be found to be disadvantageous in this case. Specifically, it should be observed that the refocusing pulse generates not only the desired spin echo but also a signal corresponding to a free induction decay (FID). By way of example, an FID may occur if the flip angle of the refocusing pulse does not equal 180° exactly and if, moreover, the z-magnetization is not equal to zero at the time of the refocusing pulse. Both conditions are satisfied in in-vivo applications. Should the center of k-space be approached, the unwanted FID experiences the same k-space encoding as the desired spin echo. Thus, the FID is superimposed on the spin echo. The signal modulation of spin echo and FID provided by off-resonant effects as a consequence of field inhomogeneities and T2* is different in each case; by way of example, the FID is refocused immediately following the refocusing pulse while the spin echo is refocused in the middle between two refocusing pulses. This leads to a distinction in the otherwise equally encoded signals, which may lead to interferences and hence to pronounced artifacts.

If, as provided for by the invention, the post-trajectory point is spaced apart from the center of k-space or even approached from outside of a region of k-space covered by the spiral segments, this leads to an effective suppression of the off-resonant FID during the acquisition interval since the FID receives a different encoding to the spin echo. The FID is suppressed particularly effectively if the post-trajectory point is located outside of the scanned k-space. A post-trajectory point located outside of the k-space may moreover lead to particularly advantageous pre-trajectories and post-trajectories. As a result, image artifacts are therefore reduced and the usability of the spiral imaging is improved.

In the case of multi-echo sequences, the above-described reversed traversing of immediately adjoining spiral segments offers particular advantages. Specifically, what should be observed is that off-resonances have negative dephasing at the start of an acquisition interval, and positive dephasing at the end of an acquisition interval. If the spiral segments are now acquired in the sequence predetermined by the spiral, there is a phase jump at the connection points of the spiral segments since there is a direct transition here from positive dephasing to negative dephasing. This phase jump leads to image artifacts. If the adjoining spiral segments are now traversed in opposite directions, positive dephasing is immediately adjoined by positive dephasing and negative dephasing is immediately adjoined by negative dephasing. This reduces the phase jumps. As a result, it is consequently possible to reduce image artifacts and improve the usability of the spiral imaging.

The above-described phase jump can also be avoided entirely, for example if provision is made for the acquisition intervals to be arranged centrally between times defined by RF pulses in a preferred variant of the method. Particularly preferably, the aforementioned RF pulses are RF refocusing pulses.

The time interval between two RF refocusing pulses is decomposed—as described above—into three intervals: the pre-trajectory starting at the pre-trajectory point kt+, the spiral segment from ksp+ to ksp−, during which the signal is acquired, and the post-trajectory to the post-trajectory point kt−. Here, the first and the last interval should be as short as possible to use as much of the available time between the refocusing pulses as possible for signal readout and hence to optimize the acquisition efficiency. It is particularly advantageous to design the transition in the first time interval in such a way that the trajectory at the time of reaching ksp+ is approached at the same speed that is also used to traverse the spiral segment.

For a planar k-space trajectory in space, use is generally made of two gradients which, without loss of generality, are denoted x- and y-gradient below. x- and y-gradient are orthogonal to one another but can be disposed in any spatial direction. The z-direction perpendicular to the x,y-plane usually serves to select layers.

The speed at which the trajectory is traversed is given by the amplitude of the gradients used to this end. The current amplitude and direction of the trajectory emerges from the vector superposition of the two x,y-gradients.

Thus, what is necessary to achieve a transition that is as smooth as possible of the pre-trajectory at the start of the approached spiral segment is that the amplitudes of the employed x,y-gradients at the end of the pre-trajectory are the same, or approximately the same, as the amplitudes used at the start of the scanning of the subsequent spiral segment.

Hence, the pre-trajectory is defined by the time profile of the two employed x,y gradients between the start value G(kt+) with preferably G(kt+)=0 and the end value G(ksp+)—which should preferably equal, or virtually equal, the value of the respective gradient at the start of the subsequent spiral segment. The area under the gradient profile is defined by the distance dK+ between kt+ and ksp+. As long as dK+ is achieved, the form of the gradient profile is free; it could also adopt a nonlinear, curved profile. A constraint is that the gradient must not exceed the maximum value Gmax defined for the gradient system; likewise, the current slope of the gradient profile must not be greater than the maximum admissible slew rate. The trajectory must therefore be located within the trapezoid defined by the maximum slew rate and the maximum gradient. The gradient profiles to be used for generating the pre-trajectory and post-trajectory are defined separately for both gradients on account of the orthogonality between x- and y-gradients.

A particularly advantageous configuration of the invention is provided if the gradient fields between the acquisition intervals are switched in such a way that the transition between pre-trajectory point kt+ and the start of the respective spiral segment ksp+ is traveled by way of a straight trajectory, wherein the trajectory tangentially merges into the subsequently read spiral segment. It may be sufficient for the trajectory to be substantially straight. Thus, having a slight curvature may be sufficient. The subsequent spiral segment is preferably a spiral segment traversed during the next acquisition interval. A spiral segment is reached as soon as a first k-space point ksp+, to be scanned, of the spiral segment can be scanned. Here, the subsequent spiral segment is approached proceeding from the pre-trajectory point kt+. Reference was already made above to the fact that this start point may coincide with the post-trajectory point but that the two points, as a rule, are separate.

Furthermore advantageous is a configuration of the invention in which provision is made for the gradient fields to be switched between the acquisition intervals in such a way that the transition between the end point ksp− of the read spiral segment and the post-trajectory point kt− of the trajectory before the next RF refocusing pulse is traveled by way of a straight post-trajectory that merges tangentially from the last point ksp− of the read spiral segment into the post-trajectory point kt−. It may be sufficient for this post-trajectory to be substantially straight. Thus, having a slight curvature may be sufficient.

Straight transition trajectories are particularly advantageous for avoiding imperfections, for instance as a result of eddies or imperfect switching behavior of the gradient systems. However, this is to the detriment of the efficiency of the scan since the start point ksp+(n) of the n-th spiral segment is respectively located in front of the end point ksp−(n−1) of the preceding spiral segment; i.e., the spiral portion situated between ksp+(n) and ksp−(n−1) is traveled over twice, once at the end of the readout of the (n−1)-th spiral segment and once at the start of the readout of the n-th spiral segment. The data points acquired during the two travels can be used, firstly, to correct imperfections but, secondly, lead to an increase in the overall readout time; i.e., more spiral segments (and hence refocusing periods) may be necessary under certain circumstances in order to scan the overall spiral given by the desired resolution and FoV. This relative lengthening of the readout, caused by redundancy, is ever greater, the more spiral elements are read (i.e., in the case of relatively short refocusing intervals) and the closer kt+, and hence kt−, are placed to the circumference of the spiral.

As a rule, if a straight, tangential approach to the start of the readout is dispensed with, any spiral segment that determines a time profile of gradient strengths of the gradient fields by solving a mathematical minimization problem can be used to improve the acquisition efficiency. Here, a time duration serves as a target functional. Preferably, this time duration is the duration of the transition trajectory between the pre-trajectory point kt+ and the subsequent start ksp+ of the spiral segment and/or between the end point ksp− of the spiral segment and the post-trajectory point kt−. Preferably, one or more boundary conditions are included in the minimization problem. By way of example, a maximum gradient strength and/or a maximum slew rate of a gradient strength can be chosen as boundary condition. The latter may be given by a limit of a peripheral nerve stimulation.

Under the given boundary conditions in respect of gradient strength and slew rate, the minimum time for crossing the transition trajectory is achieved if, for the transition trajectory, the gradient is initially switched from the initial point (kt+ or ksp−) toward Gmax at the maximum slew rate and then applied at the maximum amplitude Gmax until the surface integral under the gradient profile corresponds to the necessary dK after switching from Gmax to the respective end point (ksp+ or kt−). In the case of a sufficiently small dK, a triangular gradient profile may also result here, and so Gmax is not even reached.

The minimum time t1 min is the longer one of the respective independent minimum times calculated for the x- and y-gradient.

Particularly in the case where a two-dimensional image is acquired, there is a lower limit for t1 min given by the z-gradient that is orthogonal to the x,y-gradients. Said z-gradient, which is applied during each RF refocusing pulse for layer selection purposes in the case of a layer-selective acquisition of a two-dimensional image or a selective three-dimensional volume, must be set to zero prior to the readout of the signal. In order to avoid unwanted signals, it is frequently useful in practice to use this gradient, in each case in symmetric fashion about the RF refocusing pulse, with an amplitude that is as high as possible as a so-called spoiler gradient Gsp. The minimum time for reaching ksp+ is then restricted by the time duration tsp until this spoiler gradient is deactivated, which may be longer (and, as a rule, is longer, too) than the minimum time for reaching ksp+ given by the x,y-gradients.

In a preferred implementation, the respective start point ksp+ is in each case reached at the same time with respect to the preceding RF refocusing pulse during each refocusing interval, this time being greater than or equal to tsp. The subsequent spiral segment is then read during a time, identical in each refocusing interval, up to a time that preferably lies offset by at least tsp in relation to the subsequent RF refocusing pulse. In the case of a constant readout rate, the same number of data points are read during each refocusing interval apart from the first. Since the spiral segment read during the first refocusing interval starts in the k-space center and said spiral segment is advantageously (but not necessarily) read at the echo time in the middle of the refocusing interval, half the number of data points are read in the first refocusing interval in comparison with the subsequent refocusing intervals in the aforementioned variant of the method.

Preferably, particularly in this implementation, the start point ksp+(n) in the n-th refocusing interval is the respectively adjacent point of the end point ksp−(n−1) on the spiral trajectory in the preceding refocusing interval. In accordance with the length of the respectively read spiral segment, ksp+ and ksp− may be located, in principle, at any point on the spiral. Therefore, it is necessary to ensure that the transition time t1 min, given by the maximum gradient amplitude and the maximum slew rate, is sufficiently short. Particularly in the case of the same distance dK, the required time t1 min becomes longer if there also has to be a gradient reversal for bridging the k-space distance dK. Without loss of generality, it should therefore be noted that, in the case of k-space trajectory applied in a counterclockwise sense and a pre-trajectory point with a negative x-coordinate, the k-space points with a negative y-coordinate are approachable more quickly than the points with a positive y-coordinate.

Provision can be made for a straight line through the center of k-space and the post-trajectory point to divide the k-space into a first half and into a second half and for start points and end points of the spiral segments to be defined either in the first half or in the second half, depending on the direction of rotation of traverse in the spiral segments.

Whether and to what extent spiral points in k-space exceed the chosen time until the intended start ksp+ of the respective spiral segment depends on the exact values of the limiting factors; in particular, these are the position of kt+ and kt−, the maximum gradient strength and the maximum slew rate. The direction of rotation of scanning the spiral-shaped scanning pattern is also relevant. An example is shown in FIG. 10, which is described in more detail below. The points that exceed the chosen start time tend to be located (albeit not exclusively so) in the quadrant, lying opposite kt+, with positive ky and in the outer regions of the trajectory. Whether one of the points ksp+(n) of the n k-space segments is contained in this set in the chosen scanning scheme depends, in turn, on the length of each k-space segment. Should one or more of the start points of the spiral segments fall within this region for a chosen parameter configuration, the time to the start of the acquisition interval for at least the relevant k-space segment should be extended until the relevant point can be reached. Avoiding the relevant points can optionally be achieved by changing the refocusing interval. As an alternative to an increase in the time to the start of the relevant k-space segment, it is also possible to choose a spiral point, situated in front, as a start point of the affected spiral segment, which can be reached within the predetermined time.

Therefore, in general, the above-described measures can be taken in order to ensure that the time duration for approaching the start point of the subsequent spiral segment does not exceed a predetermined value.

The situation in relation to the transition from the end of the spiral segments to the post-trajectory point kt− is represented analogously and can be treated analogously.

In one configuration of the method, provision can be made for the start points ksp+ of the spiral segments to be set in such a way that the start points are reached within a predetermined maximum time duration. Preferably, the spiral-shaped scanning pattern comprises points in k-space which cannot be reached within the predetermined maximum time duration, in particular because an approach of these points within the maximum time duration would mean the non-observance of predetermined boundary conditions, for example because a predetermined maximum gradient strength and/or a predetermined maximum slew rate of a gradient strength would be exceeded. In order to set the start points in the manner described above, the above-described measures can be taken, for example. Equally, it may be advantageous if, as an alternative or in addition thereto, provision is made for the end points of the spiral segments ksp− to be set in such a way that, proceeding from the end points, the post-trajectory point is reached within a predetermined maximum time duration, for example the aforementioned time duration. Preferably, the spiral-shaped scanning pattern comprises points in k-space, from which the post-trajectory point cannot be reached within the predetermined maximum time duration, in particular because predetermined boundary conditions cannot be observed in the same way as described above.

Since all relevant parameters and times can be calculated very easily and quickly, a solution variant that matches the respective situation can readily be found.

In a further configuration of the method, provision can be made for the spiral segments to be traversed in a sequence that forms a permutation in relation to chronologically traversing the spiral-shaped scanning pattern formed thereby. It may be particularly advantageous if the permutation is a cyclical permutation. Changing the sequence of the acquired spiral segments can reduce the acquisition time, while providing an improved signal quality, for example by virtue of spiral segments lying further out being pulled to the fore before an inner-most spiral signal. Here, a cyclical permutation can be particularly advantageous since this, for example, minimizes jumps in the T2-weighting. By way of example, should a certain T2-contrast be obtained within the scope of a multi-echo sequence, this can be achieved by virtue of the inner-most spiral segment being encoded at a time TE. To this end, the entire spiral acquisition could be shifted back in time, without a change in a sequence. This would lengthen the sequence and a weaker signal would be available on account of the onset of the T2-decay. By way of a permutation, the inner-most spiral segment could be encoded at the time TE, wherein, advantageously, other spiral segments can be encoded there before. Other segmentation strategies known from Cartesian RARE imaging, such as a central permutation, can also be assigned analogously.

In order to facilitate acquisition with a high image resolution, provision can be made for gradient fields to be switched for spatial encoding purposes in such a way that spiral segments of a plurality of spiral-shaped scanning patterns, which differ from one another, are traversed during the acquisition intervals. In practical applications, only a restricted time is available for the signal acquisition before the signal decays. However, by acquiring a plurality of spirals, it is possible to travel across k-space to the edge of the k-space, lying further out, for each individual spiral, even in the case of relatively high image resolutions.

As a complement thereto, but also independently of these features, provision can be made in one variant of the invention for a plurality of RF pulse trains to be generated in succession, wherein spiral-shaped scanning patterns which differ from one another, more particularly which are rotated against one another, for example the aforementioned plurality of scanning patterns, are each assigned to one of the RF pulse trains.

A high image resolution can be obtained, even in the case of multi-echo sequences, as a result of such a multi-shot acquisition.

The scanning patterns are preferably rotated against one another. If there is a number of N>=2 scanning patterns, it may be advantageous in this case to choose a uniform rotation of 360°/N. What this can achieve is that a T2-weighting exists only along the radial direction.

In an advantageous configuration of the invention, provision can be made, with respect to the scanning patterns which differ from one another, for post-trajectory points to be repeatedly reached, the coordinates of which in k-space each having a predominant component along a certain direction in k-space. It may be particularly advantageous for the post-trajectory points to be identical. The direction in k-space is preferably a direction that has the highest limit for a peripheral nerve stimulation. On account of the human anatomy, this may be a direction defined by the x-gradient, in particular. Specifically, if the facts that a peripheral nerve stimulation with elevated risk may originate from the transition trajectory and that there are preferred directions here on account of the human anatomy are taken into account, it might be found to be disadvantageous if the post-trajectory points were to be rotated together with the scanning patterns. Even if such a rotation of the post-trajectory points is also included in the present invention, it may nevertheless be advantageous to take account of a possible preferred direction in the case of the post-trajectory points and to choose these as described above.

The plurality of scanning patterns preferably lie in the same plane. The scanning patterns may also be disposed in different planes, with parallel planes preferably being provided here.

In order to obtain a gradient profile to the start of the inner-most spiral segment that is as continuous as possible, provision can be made for a spiral segment containing the center of k-space to be initially traversed in the same direction, rotated through 180° about the center of k-space or mirrored at an axis of k-space.

In a further configuration, provision can be made for the spiral segment containing the center of k-space to be initially traversed in the reverse direction, with identical, or substantially identical, coverage of k-space. A correction of off-resonance effects can be performed by way of a comparison of the MR signals of the spiral segment traversed in both directions.

The various method variants described previously are compatible with the usual layer selection, in which a layer selection gradient is switched during an RF excitation pulse and, when necessary, during RF refocusing pulses, too. Then, there is two-dimensional scanning of the k-space within the excited layer. A plurality of layers can be excited for the purposes of acquiring 3D volume. This need not be implemented strictly in chronological fashion. In the case of a T2-weighting, a pulse train often has a duration of a few hundred milliseconds. The wait until the excitation of the same layer is, however, one or more seconds before there has again been sufficient build-up of magnetization that is available for excitation purposes. Then, the remaining time can be filled by virtue of other layers being excited and encoded in the meantime.

The described method variants are also compatible with other excitation types. Thus, for example, a broad layer can also be excited, within which 3D encoding is performed.

Provision can be made for gradient fields to be switched in such a way for spatial encoding that, during the acquisition intervals, spiral segments of a plurality of spiral-shaped scanning patterns situated in parallel planes of k-space are traversed. Preferably, additional phase encoding is performed here along a normal of the parallel planes within an excited layer. Off-resonance effects can be particularly problematic in the case of such a method, and so such methods can profit to a particular extent from the further features according to the invention.

For the purposes of suppressing a signal with a certain T1-time, it may be further advantageous if provision is made for an inversion pulse to be generated prior to an RF excitation pulse, in particular prior to the already aforementioned RF excitation pulse. Preferably, this is implemented to suppress a signal generated by the cerebrospinal fluid.

Further, the invention has a particular effect if provision is made for the application of a fat signal-suppressing pulse sequence.

BRIEF DESCRIPTION OF THE DRAWINGS

Now, the invention is described on the basis of a few exemplary embodiments without, however, being restricted to these few exemplary embodiments. Further exemplary embodiments emerge from combining the features of individual claims or of a plurality of claims, either among themselves and/or with individual features or a plurality of features of the exemplary embodiments.

In the drawings:

FIGS. 5A and 5B shows a comparison of an alternating (FIG. 5A) and identically oriented (FIG. 5b) spatial encoding and approach of spiral segments.

DETAILED DESCRIPTION

In the following description of the invention, elements that correspond in terms of their function are provided with corresponding reference signs, even in the case of a deviating design or form.

Figure 1:
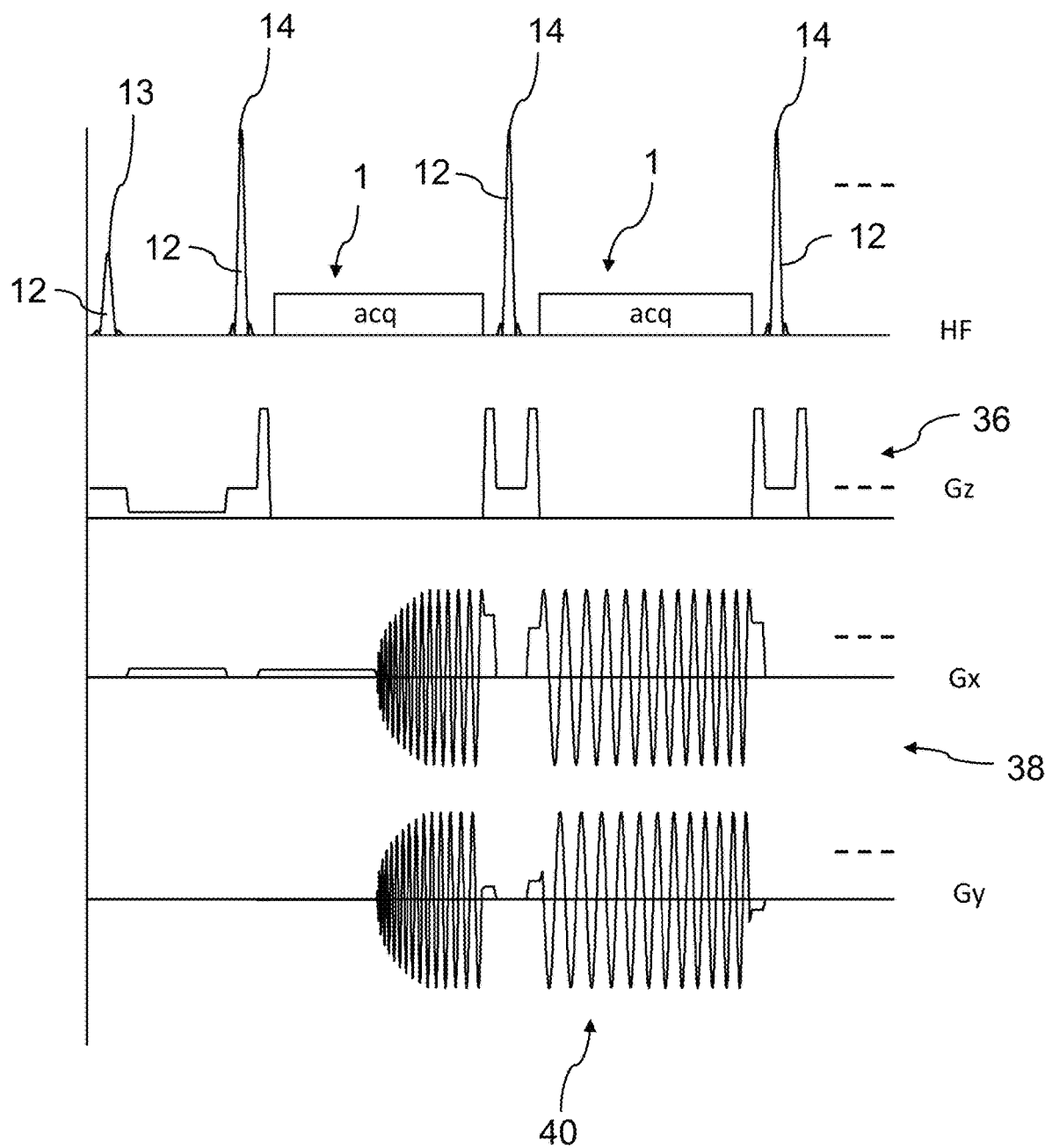
FIG. 1 shows a sequence diagram for a method embodied according to the invention.

FIG. 1 shows a sequence diagram for a method embodied according to the invention. The measurement sequence is a RARE sequence with a spiral-shaped k-space trajectory 11. Only the start of the sequence with two refocusing periods is illustrated.

Following a time period of TE/2 and after an RF excitation pulse 13, forming an RF pulse 12, with a flip angle of 90°, a sequence of RF pulses 12, embodied as RF refocusing pulses 14 with a flip angle of 180°, is generated with an equidistant spacing of TE and radiated into a test object by means of an RF transmission coil and an MM device.

Respectively at a midpoint between two RF pulses 12, a spin echo is formed, which is captured in the acquisition intervals 1 ("acq"). The acquisition intervals 1 are each disposed symmetrically between two RF pulses 12 and 14. RF receiver coils are used, during the acquisition intervals 1, to record an MR signal emitted by the test object.

Using the layer selection gradient Gz, the temporal amplitude profile 36 of which is explicitly illustrated in FIG. 1, a layer is excited in conventional fashion such that a transversal magnetization in the test object is only generated in a single planar layer so that an MR signal is only emitted by, and recorded from, this planar layer.

Further, the time profiles 38, 40 of the gradient strengths of the spatial encoding gradients Gx and Gy are shown in FIG. 1.

Figure 2:
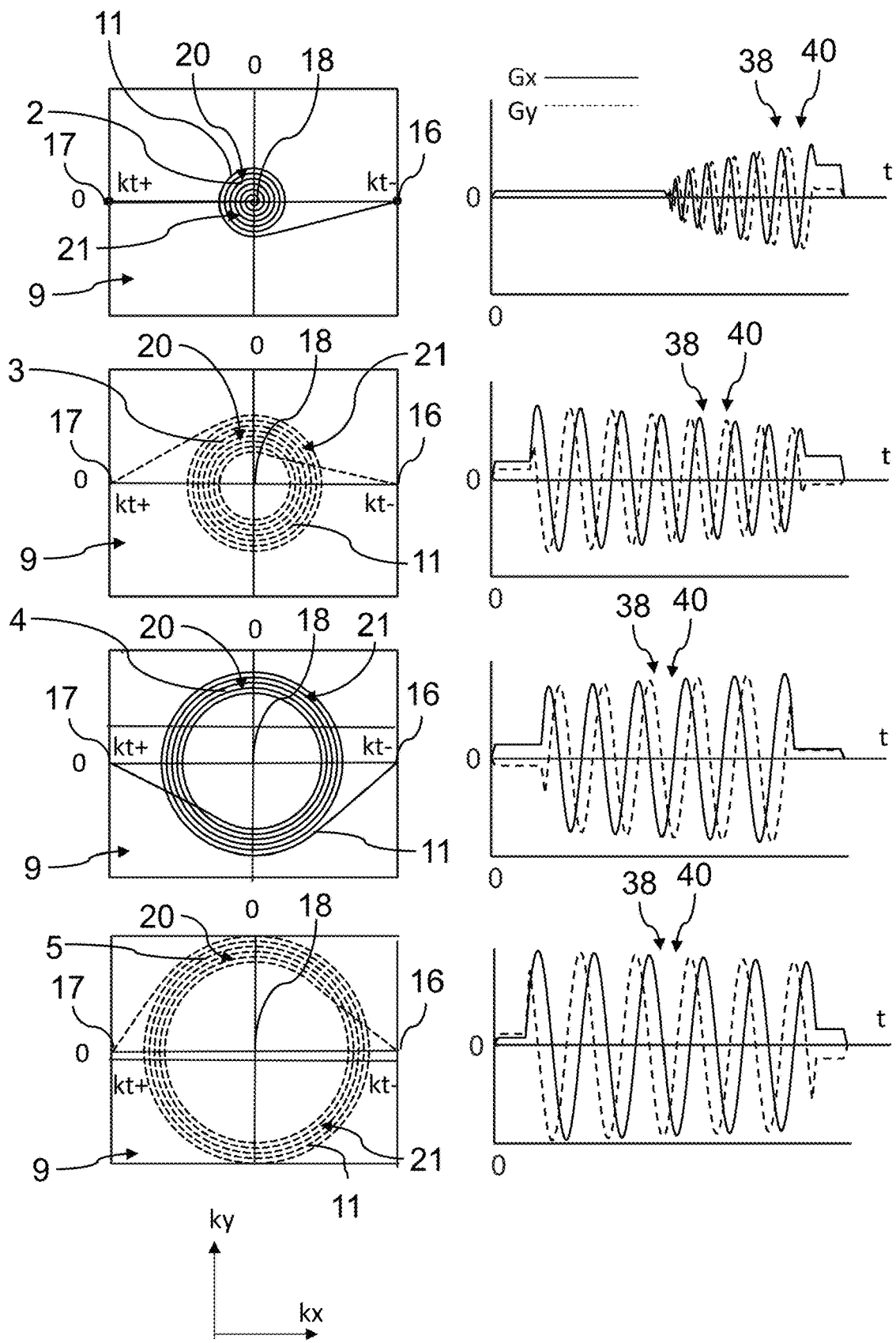
FIG. 2 shows alternate traversing, configured according to the invention, of spiral segments and time profiles of the switched gradient fields.

Here, the gradient fields are switched in such a way that, during the acquisition intervals 1, individual spiral segments 2, 3, 4, . . . (similar to what is shown in FIG. 2) of a spiral-shaped, planar scanning pattern 10, which is formed in k-space 9, are traversed. TE/2 after the first refocusing pulse, an inner spiral segment 2 is initially traversed, proceeding from the center 18 of k-space 9. To this end, the sinusoidally oscillating gradient strengths of the Gx- and Gy-gradients are initially increased up to a maximum gradient strength, taking account of predetermined boundary conditions determined by technology and physiology, and the oscillation frequency is reduced the further the encoding moves away from the center 18 of k-space 9. Thereupon, the subsequent spiral segments 2, 3, 4, . . . are traversed alternatively from the outside to the inside and, thereupon, from the inside to the outside again. To this end, the oscillation frequency and the phase of the switched gradients are adapted in suitable fashion.

Outside of the acquisition intervals 1, the same post-trajectory point 16 situated outside of a region 20 of k-space 9 covered by the recording is respectively approached at a time, defined by the respective RF pulse 12, before each of the RF refocusing pulses 14.

In FIG. 1, the post-trajectory point 16 is reached immediately before the respective RF refocusing pulse 14 is generated.

FIG. 2 shows, on the left, alternating traversing, configured according to the invention, of spiral segments 2 to 5 and, on the right, associated time profiles 38, 40 of the gradient strengths of the switched x- and y-gradient fields. Shown are, from top to bottom, four spiral segments 2 to 5 with increasing radius.

The trajectory 11 starts in k-space 9, initially outside of an acquisition interval 1 and shortly after application of the first RF refocusing pulse 14, at the pre-trajectory point kt+, labeled as 17, which is located on the negative kx-axis and preferably located outside of the region 20 covered by the spiral segments 2 to 5 or outside of the coverage 21 of k-space 9 brought about by the spiral segments 2 to 5.

Spatial encoding of the inner-most spiral segment 2 starts at the time of the first spin echo. Here, the spiral segment 2 is traversed from the inside to the outside and in counterclockwise fashion. Following the acquisition of the inner-most spiral segment 2, the post-trajectory point kt−, denoted by 16, is approached. The coordinates of the post-trajectory point 16 kt− are inverted in relation to the pre-trajectory point 17 kt+. One could also say that pre-trajectory point 17 and post-trajectory point 16 are rotated through 180° against one another about the center 18 of k-space 9.

The 180° RF refocusing pulse also inverts the coordinates of the post-trajectory point 16 kt−, and so the trajectory 11 reaches the pre-trajectory point 17 kt+ again.

Thereupon, the trajectory 11 is continued from the pre-trajectory point 17 kt+ again and the next spiral segment 3 is approached. Here, this spiral segment 3 is traversed from the outside to the inside and in clockwise fashion, and consequently traversed in the opposite direction in relation to the spiral segment 2 adjoining on the inside.

After the post-trajectory point 16 kt− has been reached, the remaining two spiral segments 4 and 5 are thereupon traversed in corresponding fashion, respectively in alternating directions.

Figure 3A:
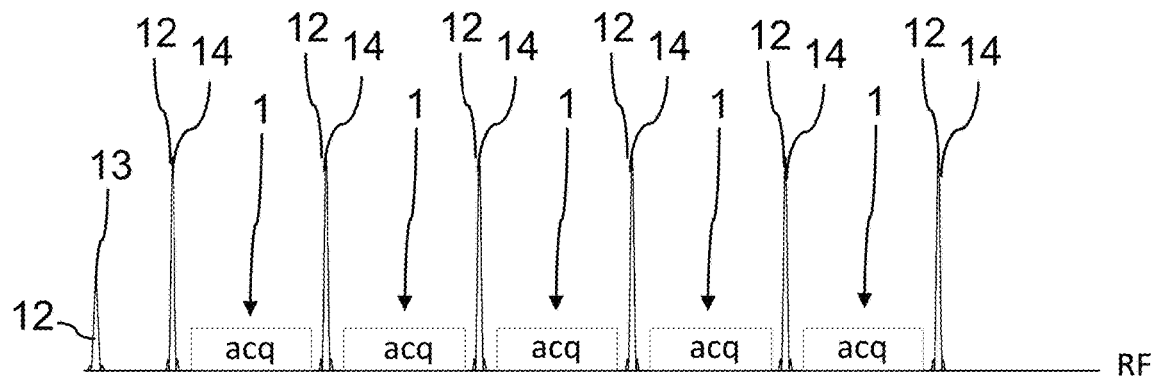
FIGS. 3A to 3C show a multi-echo sequence with gradient switching according to the invention, with an alternation between and cyclical permutation of spiral segments.
Figure 3B:
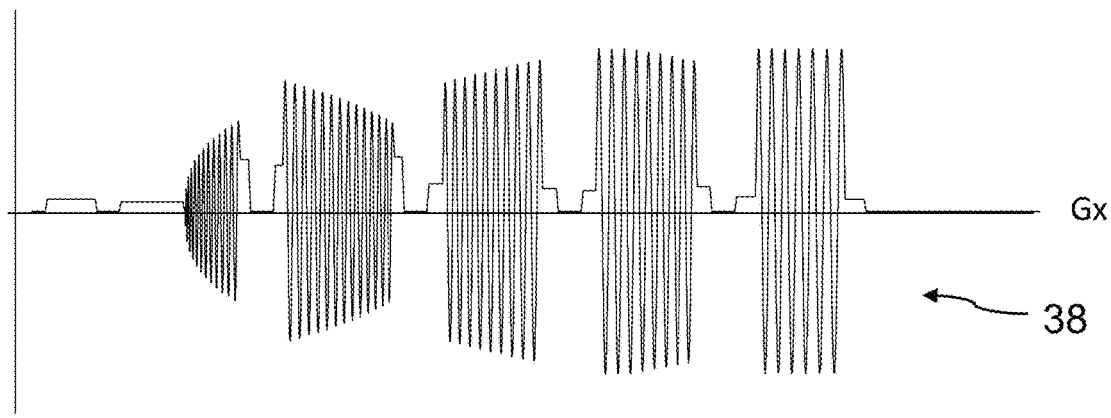
Figure 3C:
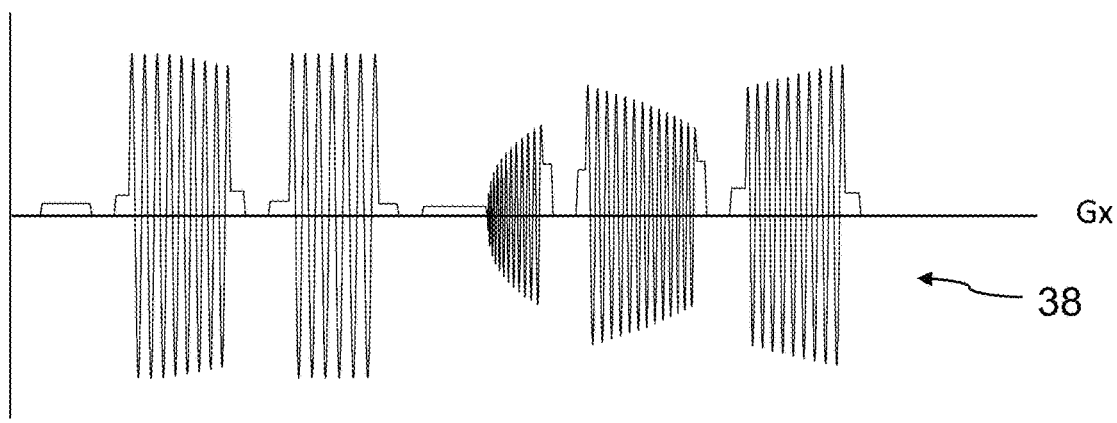

FIGS. 3A to 3C show a multi-echo sequence with gradient switching according to the invention, with alternation between, and cyclical permutation of, spiral segments 2 to 6, not explicitly illustrated here. FIG. 3A shows a RARE pulse train with five acquisition intervals 1, which is similar to the pulse train illustrated in FIG. 1.

FIG. 3B shows the time profile 38 of the gradient strength of the x-gradient. It is evident from this profile 38 that the spiral segments 2 to 6 are traversed alternatingly from inside to outside and from outside to inside, but in the sequence that corresponds to chronological traversing of the spiral-shaped scanning pattern formed thereby.

FIG. 3C shows an alternative time profile 38 of the gradient strength of the x-gradient. In comparison with the profile shown in FIG. 3B, the sequence of the spiral segments 2 to 6 has been cyclically permutated, and so the inner-most spiral segment 2 is no longer traversed at the start of the pulse train but in the middle of the pulse train. Since the image contrast is decisively determined by the inner-most spiral segment, MR images reconstructed from the respectively recorded MR signals therefore have a different image contrast with a stronger T2-weighting in FIG. 3C.

Figure 4A:
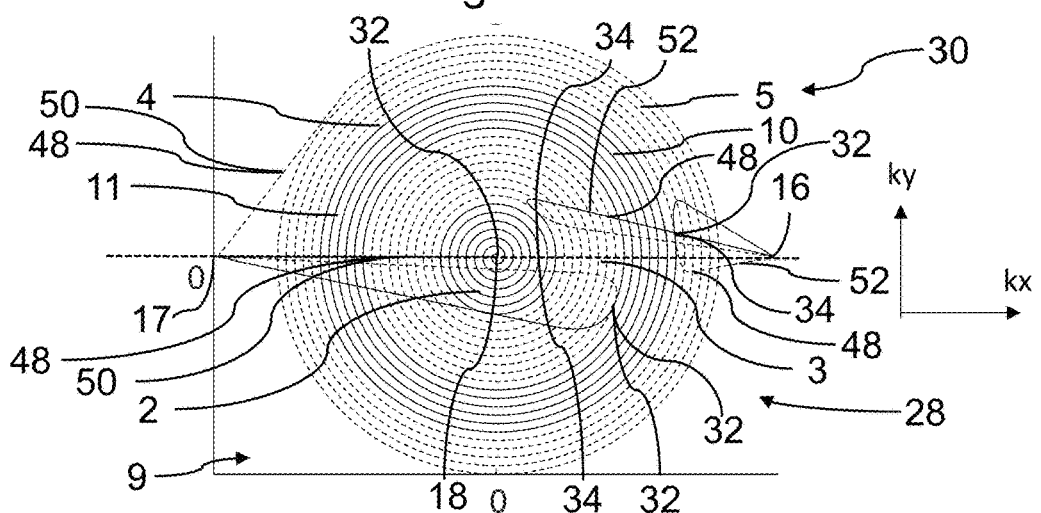
FIGS. 4A to 4C show different transition trajectories to and from unchanging post-trajectory points and pre-trajectory points.
Figure 4B:
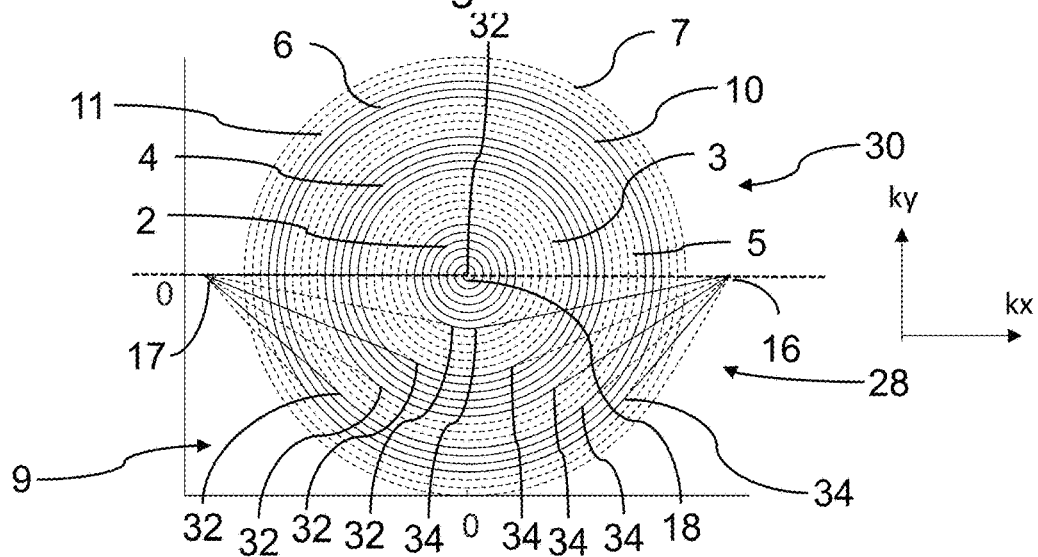
Figure 4C:
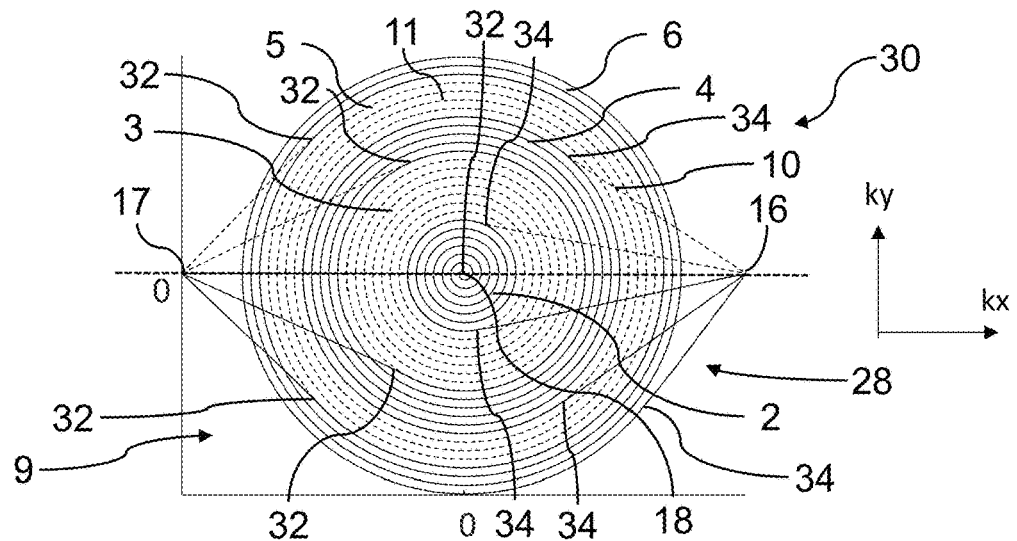

FIGS. 4A to 4C show different transition trajectories 48 to and from unchanging post-trajectory points 16 and pre-trajectory points 17. The transition trajectories 48 are composed of pre-trajectories 50 and post-trajectories 52. The pre-trajectories 50 comprise the trajectories from the pre-trajectory point 17 to the start point ksp+ 32 of a subsequent spiral segment 2 to 7. The post-trajectories 52 comprise the trajectories from the end point ksp− 34 of a spiral segment to the post-trajectory point 16. For clarity, FIG. 4A only explicitly provides the transition trajectories 48, 50, 52 to and from the inner-most spiral segment 2 and the transition trajectories 48, 50, 52 of the outer-most spiral segment 5 with reference signs. Pre-trajectories 50 and post-trajectories 52 are also found, for example, in FIG. 4B to FIG. 6B and FIG. 8 to FIG. 10, with not all transition trajectories 48 being explicitly provided with reference signs in these drawings either. In FIG. 4A, the spiral segments 2 to 5 are traversed in alternating directions. Adjoining spiral segments have no overlap or at best a small overlap. However, the transition trajectories 48 often have strong curvatures and often also have a direction reversal. Therefore, large changes in the gradient strengths are necessary in part for the transition trajectories 48.

In FIG. 4B, the spiral segments 2 to 7 are each traversed in the same direction of rotation. The pre-trajectories 50 and the post-trajectories 52 are straight or only slightly curved trajectories and therefore have no change in direction. The transition trajectories 48 and the spiral segments 2 to 7, adjoining these beforehand and afterwards, merge tangentially into one another. The start points 32 and the end points 34 of the spiral segments 2 to 7 all lie in a first half 28 of k-space 9, to be precise in the half of k-space 9 with a ky-coordinate of less than or equal to zero in accordance with the counterclockwise rotational sense of the spiral in the counterclockwise-sense.

In contrast to FIG. 4B, the spiral segments 2 to 6 in FIG. 4C are respectively traversed in successively opposite directions of rotation. The transition trajectories 48 are likewise straight and tangentially merge into the spiral segments 2 to 6. The start points ksp+ 32 and the end points ksp− 34 of the counterclockwise spiral segments 2, 4 and 6 all lie in a first half 28 of k-space 9, to be precise in the half of k-space 9 with a ky-coordinate of less than or equal to zero. The start points 32 and end points 34 of the clockwise spiral segments 3 and 5 all lie in a second half 30 of k-space 9, to be precise in the half of k-space 9 with a ky-coordinate of greater than zero.

Although adjoining spiral segments 2 to 7 have a slightly greater overlap in FIGS. 4B and 4C than in FIG. 4A, the transition trajectories 48 in FIG. 4B and FIG. 4C are realizable by significantly weaker gradient strengths. Further, the spiral segments 2 to 7 in FIGS. 4B and 4C are embodied in such a way that start points 32 and end points 34 of the spiral segments 2 to 7 lie either in the first half 28 or in the second half 30, depending on the direction of rotation of a traverse of the spiral segments 2 to 7.

FIGS. 5A and 5B show a comparison of alternating spatial encoding (FIG. 5A) and spatial encoding with the same orientation (FIG. 5B) and approach of spiral segments 2 to 4. Details in this respect can be gathered directly from the drawings on the basis of what has already been described above.

Figure 6A:
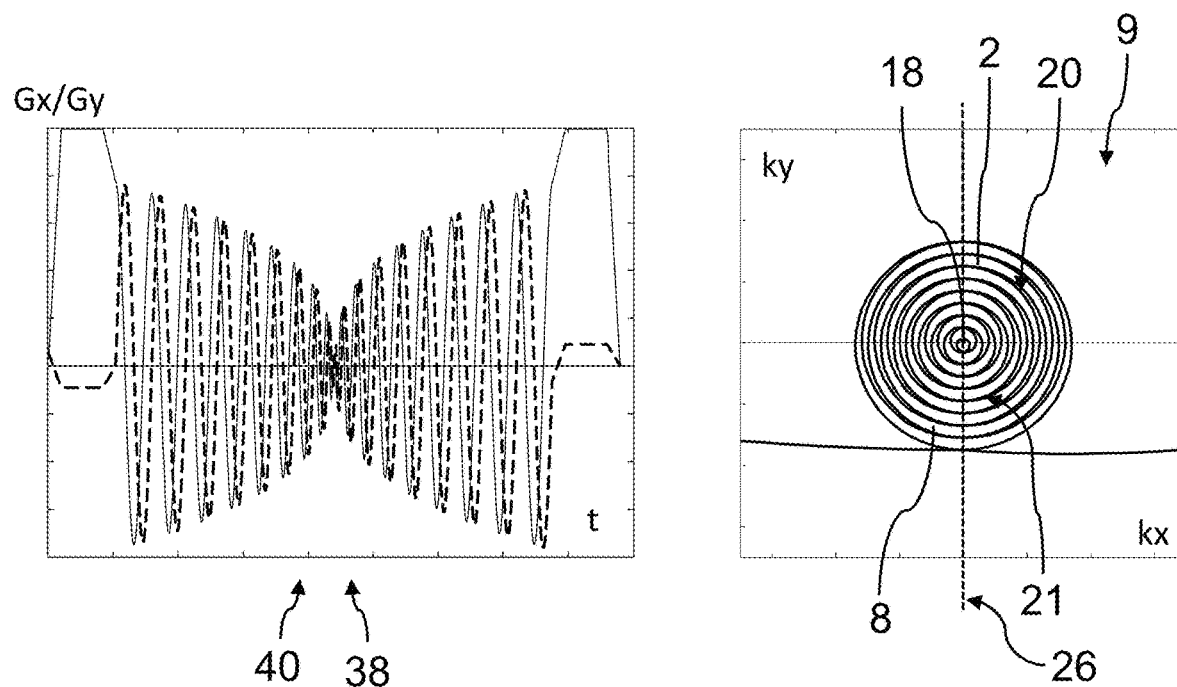
FIG. 6A shows a spiral segment covering the center of k-space, said spiral segment initially being reflected at the ky-axis but being traversed with the same orientation.

FIG. 6A shows, on the right, a spiral segment 2 which covers the center 18 of k-space 9 and which is initially reflected at the ky-axis but which is traversed as a spiral-shaped approach 8 with the same orientation and in a manner preceding segment 2 in time. Shown on the left are the time profiles 38, 40 of the gradient strengths of the correspondingly switched x- and y-gradients.

Figure 6B:
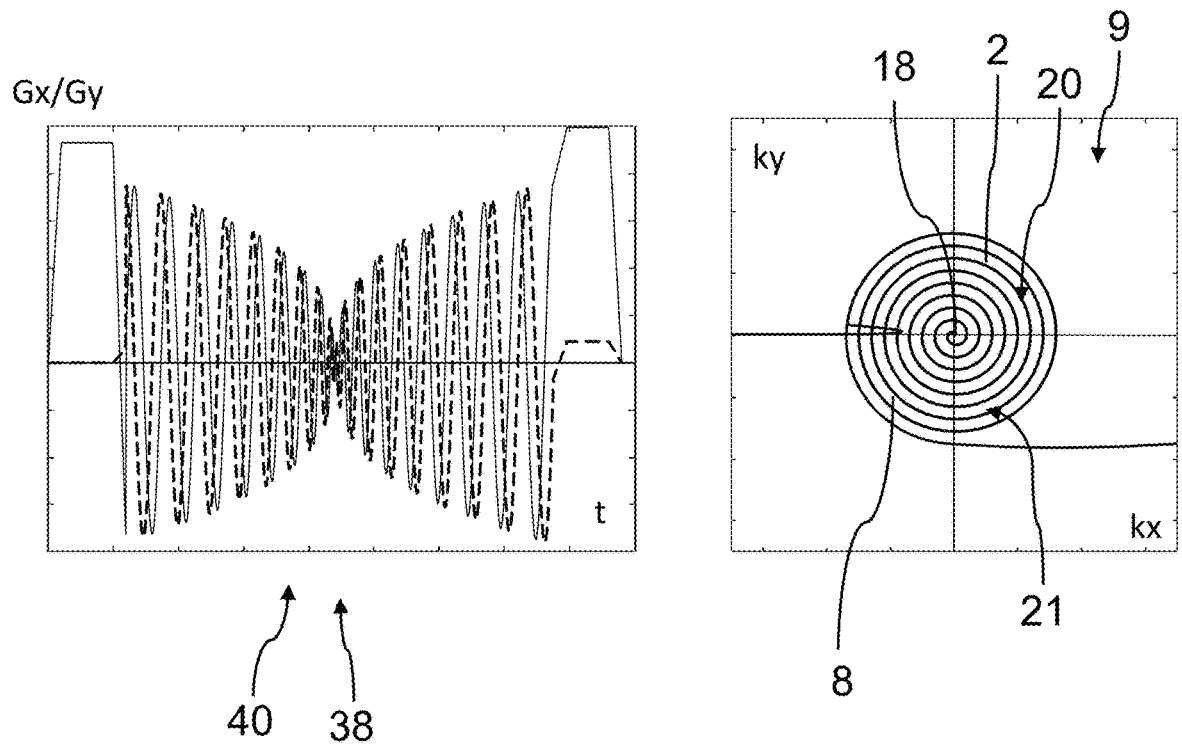
FIG. 6B shows a spiral segment covering the center of k-space, said spiral segment initially being traversed in the reverse direction.

FIG. 6B shows a spiral segment 2 which covers the center 18 of k-space 9 and which is initially traversed in the opposite direction as a spiral-shaped approach 8 in a manner preceding segment 2 in time. Shown on the left are the time profiles 38, 40 of the gradient strengths of the correspondingly switched x- and y-gradients.

Figure 7A:
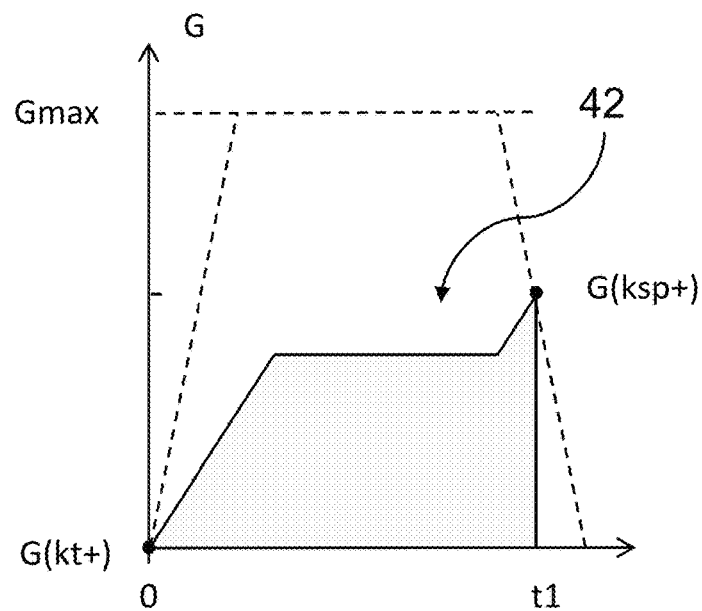
FIGS. 7A to 7C show schematic illustrations of gradient profiles for forming a pre-trajectory.
Figure 7B:
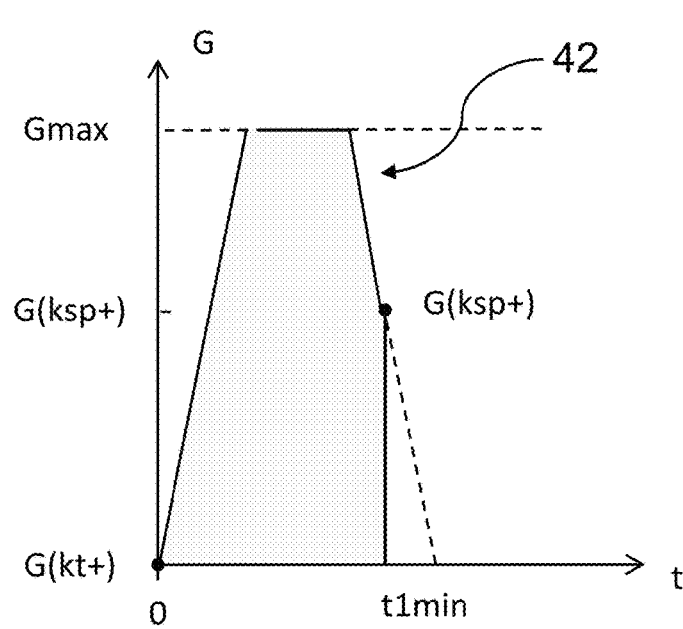
Figure 7C:
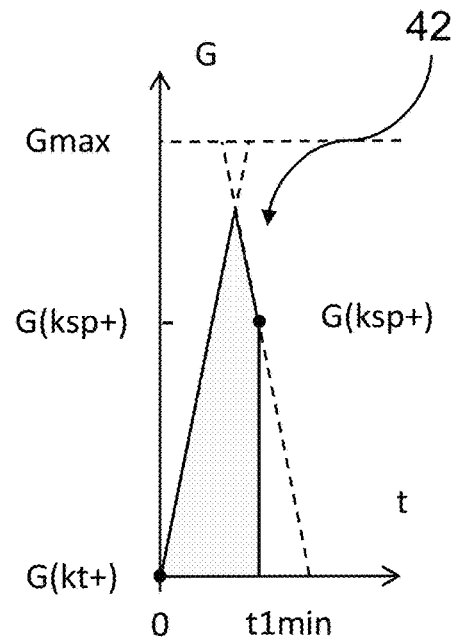

FIGS. 7A to 7C show schematic illustrations of gradient profiles of a gradient for forming a pre-trajectory 50. By way of example, the gradient can be the x-gradient or the y-gradient. The gradient strength is denoted by G. The maximum admissible gradient strength is Gmax. The gradient strength at the pre-trajectory point kt+ is zero in each case; the start point ksp+ of the next spiral segment to be scanned is reached at the end of the gradient profile. The spiral segment to be subsequently scanned should initially be scanned with a gradient strength G(ksp+). The gradient profile of the pre-trajectory 50 likewise ends with the gradient strength G(ksp+). The angled dashed lines indicate the maximum obtainable slew rate. The area under the gradient corresponds to the distance dK, which is traveled in k-space.

The same distance dK is traveled in FIG. 7A and FIG. 7B. However, the target point ksp+ is reached at a minimum time t1 min under the given boundary conditions in FIG. 7B, since the gradient is traversed with maximum slew rate and gradient strength. The boundary conditions are not fully exploited in FIG. 7A, and so the target point ksp+ is only reached after t1>t1 min.

In FIG. 7C, kt+ and ksp+ are closer together, and so the target point ksp+ has already been reached after such a short time t1 min that, on account of the restricted slew rate, the gradient strength Gmax has not been reached.

Figure 8:
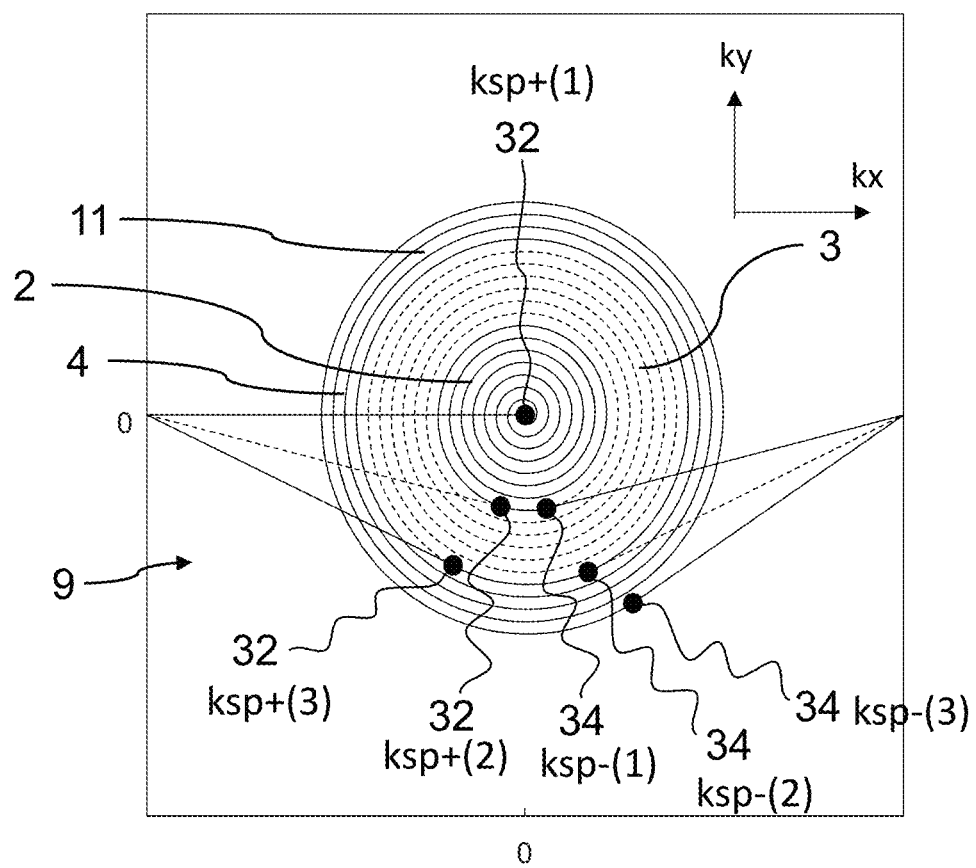
FIG. 8 shows an illustration of spiral segments in k-space and the position of the k-space points at the start and end of each k-space segment in the case of tangential pre- and post-trajectories.

FIG. 8 shows an illustration of spiral segments 2, 3, 4 in k-space 9 and the position of the k-space points at the start and end of each spiral segment 2, 3, 4 in the case of tangential transition trajectories 48, wherein the start point 32 of the n-th spiral segment 2, 3, 4 is denoted by the point ksp+(n) and wherein the end or the end point 34 of the n-th spiral segment 2, 3, 4 is denoted by the point ksp−(n). Under the conditions shown in this exemplary embodiment, the start point 32 ksp+(n) of the n-th spiral segment 2, 3, 4 is therefore respectively situated in front of the end point 34 ksp−(n−1) of the preceding spiral segment 2, 3, 4 in the case of the tangential approach to the respective spiral segment 2, 3, 4, and so the spiral portion situated therebetween is traveled over twice. This and the consequences thereof have already been explained in more detail further above.

Figure 9A:
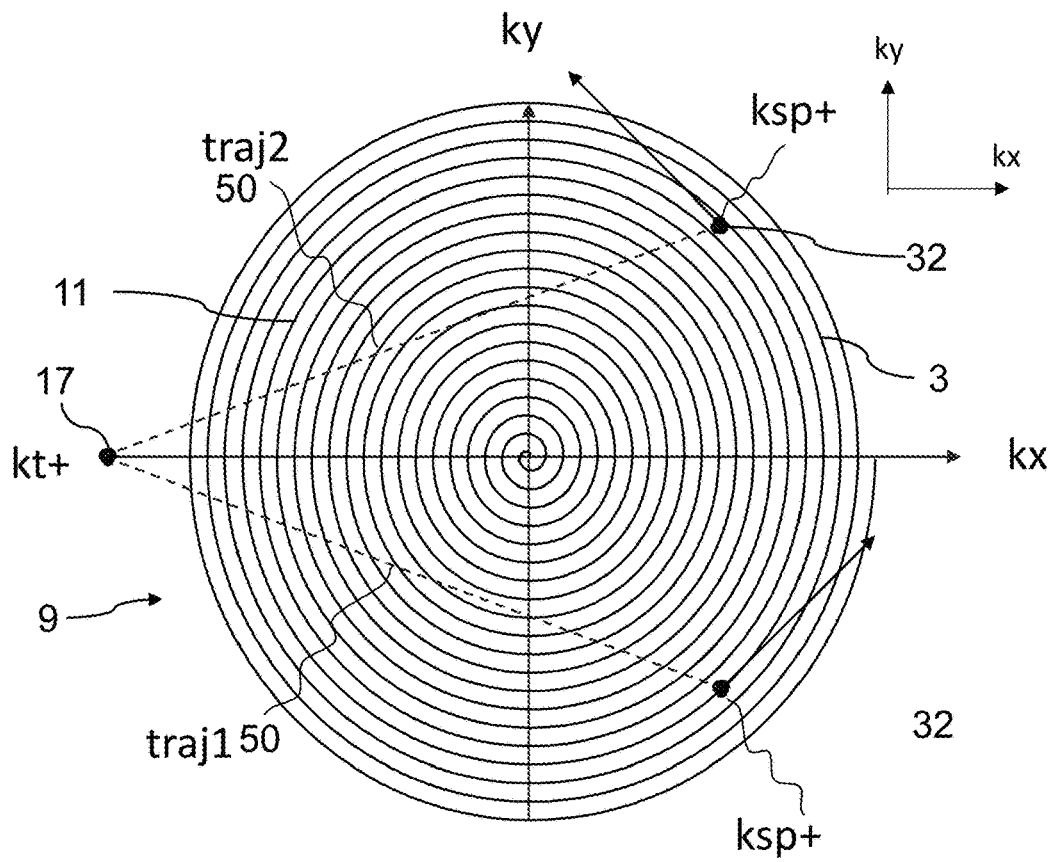
FIGS. 9A to 9c show an illustration of two start points ksp+, mirrored in relation to the kx-axis, and associated gradient profiles of the pre-trajectories.
Figure 9B:
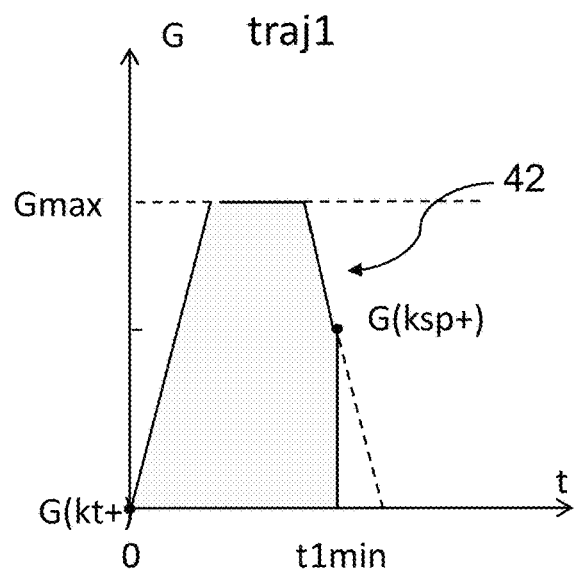
Figure 9C:
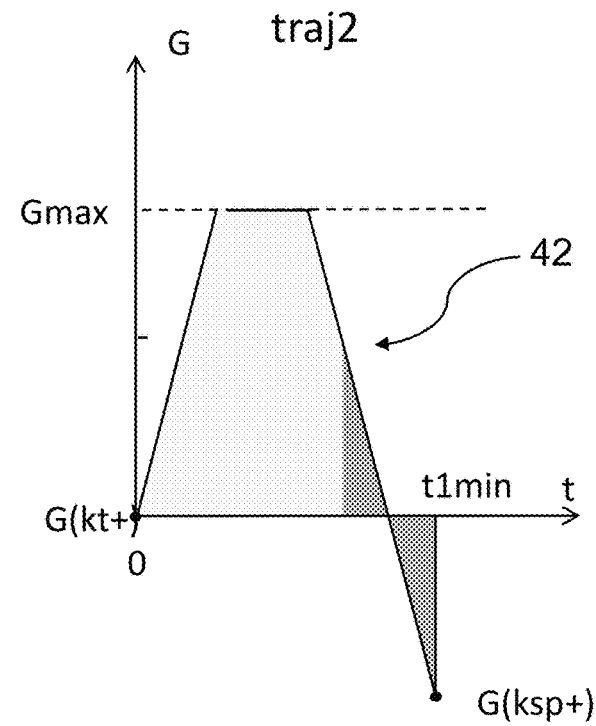

On the basis of two start points ksp+32 which are mirrored with respect to the x-axis, FIG. 9A shows that the minimum time for reaching these start points 32 is shorter for the start point 32 in which the pre-trajectory 50 (also denoted traj1 in FIG. 9A) of the approached spiral segment 3 initially moves in the same direction along the x-axis as the rotational sense of the spiral. FIG. 9B shows a time profile of the gradient strength of the x-gradient for the pre-trajectory 50 (traj1). FIG. 9C shows the corresponding time profile of the gradient strength of the x-gradient for the pre-trajectory 50 (traj2). The period of time of the area drawn darker in FIG. 9C at the end of the switching time period of the x-gradient is not necessary in traj1, where there is no direction reversal. The period of time until the signal readout of the next spiral segment 3 is reached is shorter if no direction reversal is required until the start of scanning the next spiral segment 3.

Figure 10:
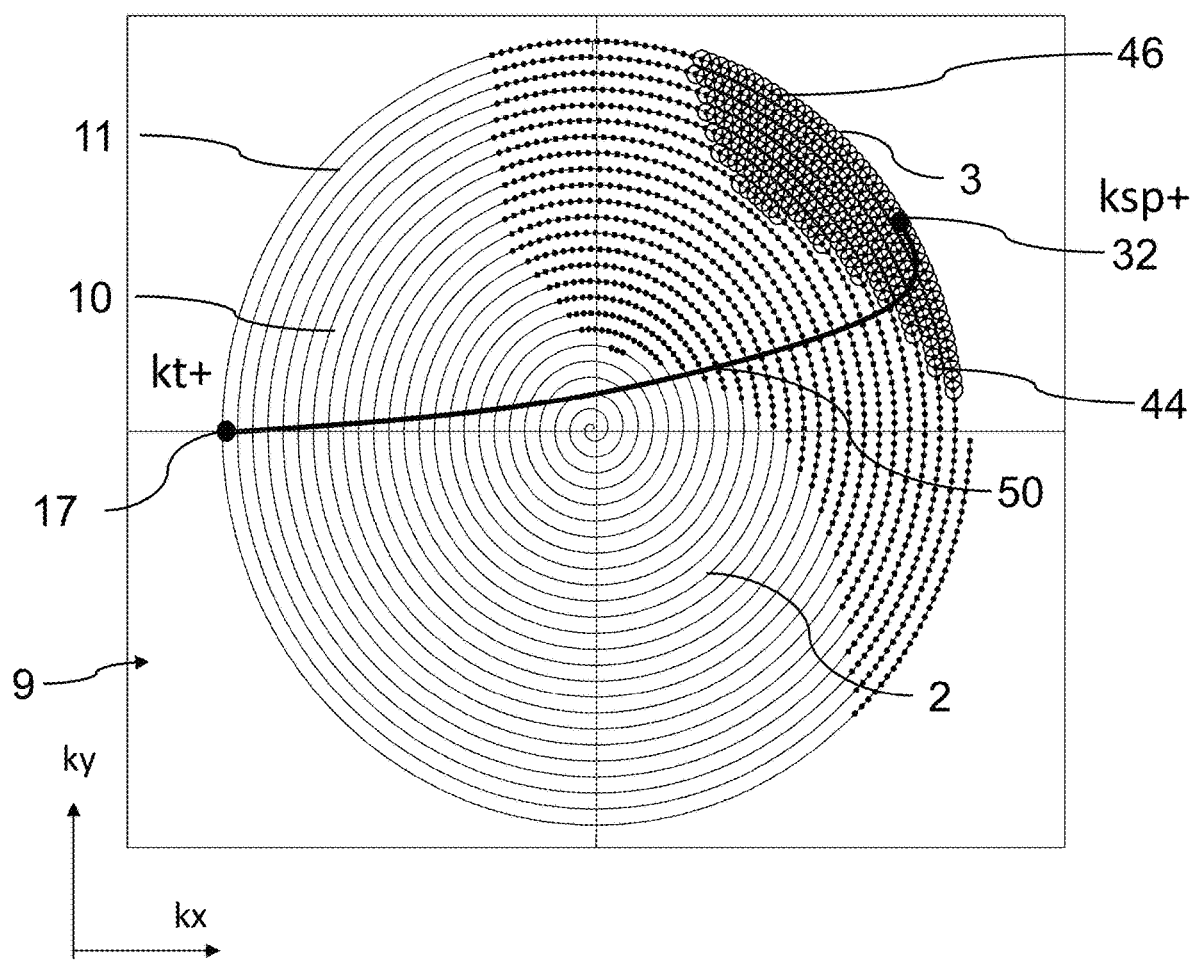
FIG. 10 shows a spiral-shaped scanning pattern and a pre-trajectory to a next spiral segment.

FIG. 10 shows a spiral-shaped scanning pattern 10 and a pre-trajectory 50 to a next spiral segment 3. In the exemplary embodiment described herein in exemplary fashion, the resultant image resolution is 1 mm. The time for reaching the spiral from a pre-trajectory point kt+ at the edge of the k-space 9 required for this resolution is longer than 1.2 ms for the start points 32 of the subsequent spiral segment 3 highlighted by unfilled circles or longer than 1 ms for the start points 32 highlighted by emboldened points, in relation to a gradient system with Gmax=30 mT/m and slew rate slewmax=150 T/m/s. The solid line shows, in exemplary fashion, a pre-trajectory 50 to one of the relevant start points 32, for which the duration of the pre-trajectory 50 is 1.2 ms. Consequently, FIG. 10 illustrates that the time duration of the pre-trajectory 50 is predominantly elevated in the quadrant which lies opposite the start point 17 and which is located in the upper region of k-space 9 when traveling the spiral segment 3 in counterclockwise fashion. By way of example, should the maximum duration of the pre-trajectory 50 be 1.2 ms, the start points 32 highlighted by unfilled circles cannot be reached. The sequence can be adapted in this case. By way of example, other start points 32, which are reachable within a time duration of 1.2 ms, could be selected. Other measures have already been described further above.

It may be expedient if the start points 32 are chosen in such a way that they are not located in the above-described quadrant. As an alternative or in addition thereto, it may be advantageous if the start points 32 are chosen in such a way that the pre-trajectory 50 transitions into the scanning of the subsequent spiral segment 3 without a direction reversal. These advantages take hold not only in relation to the above-described exemplary embodiment but apply in general within the scope of the described invention.

In summary, the invention considers improvements in MR spiral imaging. To this end, the invention proposes that spiral segments 2 to 8 be reordered, in particular alternately traversed and/or permuted. Moreover, repeatedly approaching the same post-trajectory points 16 between the acquisitions of the spiral segments 2 to 8 is proposed, wherein the post-trajectory points 16 are located outside of the center 18 of k-space 9, preferably outside of a region 20 of k-space 9 covered by the spiral segments 2 to 8.

LIST OF REFERENCE SIGNS

1 Acquisition interval
2 Spiral segment
3 Further spiral segment
4 Further spiral segment
5 Further spiral segment
6 Further spiral segment
7 Further spiral segment
8 Spiral-shaped manifestation of the approach to the central spiral segment 9 k-space
10 Scanning pattern
11 Trajectory in 9
12 RF pulse
13 RF excitation pulse
14 RF refocusing pulse
16 Post-trajectory point kt−
17 Pre-trajectory point kt+
18 Center of 9
20 Region of 9
21 Coverage of 9
22 Start time
24 End time
26 Axis of 9
28 A first half of 9
30 A second half of 9
32 Start point ksp+ of a spiral segment
34 End point ksp− of a spiral segment
36 Time profile of the gradient strength of the z-gradient
38 Time profile of the gradient strength of the x-gradient
40 Time profile of the gradient strength of the y-gradient
42 Time profile of the gradient strength of a gradient
44 Point in k-space
46 Further point in k-space
48 Transition trajectory
50 Pre-trajectory
52 Post-trajectory

The invention claimed is:

1. A magnetic resonance imaging method, comprising
providing acquisition intervals (1) during which a magnetic resonance signal is acquired,
switching gradient fields in such a way for spatial encoding that spiral segments (2 to 8) of a spiral-shaped scanning pattern (10) formed in k-space (9) and having different outer radii are traversed during the acquisition intervals (1), and
the gradient fields are switched between the acquisition intervals (1) such that a same post-trajectory point (16) in the k-space (9) is repeatedly reached, and the post-trajectory point (16) is spaced apart from a center (18) of the k-space (9) and located outside of a region (20, 21) of the k-space (9) covered by the spiral segments (2 to 8).

2. The method as claimed in claim 1, wherein the gradient fields are switched between the acquisition intervals such that at least one of the post-trajectory point (16) is reached within a minimal period of time or a subsequent spiral segment (2 to 8) is reached within a minimal period of time.

3. The method as claimed in claim 1, further comprising determining a time profile (36, 38, 40) of gradient strengths of the gradient fields by solving a mathematical minimization problem, and choosing a time duration as a target functional.

4. The method as claimed in claim 1, further comprising setting start points (32) of the spiral segments (2 to 8) such that a subsequent spiral segment (2 to 8) is reached in at least one of tangential fashion or at a scanning speed provided for spatial encoding of the subsequent spiral segment (2 to 8), and setting end points (34) of the spiral segments (2 to 8) such that a trajectory (11) approaching the post-trajectory point (16) tangentially contacts the ending spiral segment (2 to 8).

5. The method as claimed in claim 1, further comprising switching the gradient fields between the acquisition intervals such that a transition between a pre-trajectory point (17) formed in the k-space (9), the k-space coordinates of said pre-trajectory point being given by the negative k-space coordinates of the post-trajectory point (16), and a start point (32) of a subsequent spiral segment (2 to 8) is traveled by way of a straight k-space trajectory or a k-space trajectory having a curvature, and the k-space trajectory tangentially merges into a subsequently read spiral segment.

6. The method as claimed in claim 1, further comprising switching the gradient fields between the acquisition intervals such that a transition between an end point (34) of a traversed spiral segment (2 to 8) and the post-trajectory point (16) is traveled by way of a straight k-space trajectory or a k-space trajectory having a curvature, which merges tangentially from the end point (34) into the post-trajectory point (16).

7. The method as claimed in claim 1, further comprising setting start points (32) of the spiral segments (2 to 8) such that the start points (32) are reached within a predetermined maximum time duration, with the time duration being a duration of a transition trajectory between a pre-trajectory point and a subsequent start of the spiral segment, and the spiral-shaped scanning pattern (10) comprises points in k-space (9) which cannot be reached within the predetermined maximum time duration.

8. The method as claimed in claim 1, further comprising traversing adjacent ones of the spiral segments (2 to 8), which directly follow one another in the k-space (9) in the spiral-shaped scanning pattern (10), in opposite directions, wherein even-numbered ones of the spiral segments (2, 4, 6, 8) are alternately traversed in the opposite direction to odd-numbered ones of the spiral segments (1, 3, 5, 7).

9. The method as claimed in claim 8, wherein the acquisition intervals (1) are arranged centrally between times defined by RF pulses (12, 14).

10. The method as claimed in claim 8, wherein the spiral segments are traversed in a sequence that forms a permutation with respect to chronologically traversing the spiral-shaped scanning pattern (10) formed thereby, and the permutation is a cyclical permutation.

11. The method as claimed in claim 8, further comprising switching the gradient fields such that for spatial encoding during the acquisition intervals (1) the spiral segments (2 to 8) of a plurality of spiral-shaped scanning patterns (10) which differ from one another are traversed and, with respect to the scanning patterns (10) which differ from one another, post-trajectory points (16) are repeatedly reached, coordinates of which in the k-space (9) each have a predominant component along a certain direction in the k-space (9).

12. The method as claimed in claim 11, wherein the coordinates in the k-space (9) each having the predominant component along the certain direction in the k-space (9) that is defined by the x-gradient, wherein the post-trajectory points (16) are identical.

13. The method as claimed in claim 8, further comprising generating a sequence of spin echoes by an RF excitation pulse (13) and subsequent RF refocusing pulses (12, 14), and the acquisition intervals (1) are provided between the RF refocusing pulses (12, 14).

14. The method as claimed in claim 13, wherein the RF excitation pulse (13) and the subsequent RF refocusing pulses (12, 14) form an RF pulse train and the method includes generating a plurality of RF pulse trains in succession, wherein spiral-shaped scanning patterns (10) which differ from one another are each assigned to one of the RF pulse trains.

15. The method as claimed in claim 14, wherein the spiral-shaped scanning patterns (10) differ from one another by being rotated against one another.

16. The method as claimed in claim 14, wherein before a spiral segment (2) containing a center (18) of the k-space (9) is traversed, a spiral-shaped approach (8) to the spiral segment (2) with a same k-space coverage (20, 21) is traversed in a reverse direction relative to a rotational sense of the spiral segment (2).

17. The method as claimed in claim 14, wherein before a spiral segment (2) containing a center (18) of the k-space (9) is traversed, a spiral-shaped approach (8) to the spiral segment (2) is traversed in a same direction as a rotational sense of the spiral segment (2), in a manner rotated through 180° about the center (18) of k-space (9) or reflected in an axis (26) of k-space (9).

18. The method as claimed in claim 8, further comprising switching the gradient fields for spatial encoding such that, during the acquisition intervals (1), the spiral segments (2 to 8) of a plurality of spiral-shaped scanning patterns (10) situated in parallel planes of the k-space (9) are traversed.

19. The method as claimed in claim 18, wherein additional phase encoding is performed along a normal of the parallel planes within an excited layer.

\* \* \* \* \*